United States Patent
Stapleton

(10) Patent No.: US 6,618,096 B1
(45) Date of Patent: Sep. 9, 2003

(54) SYSTEM AND METHOD FOR ADAPTIVELY BALANCING QUADRATURE MODULATORS FOR VESTIGIAL-SIDEBAND GENERATION

(75) Inventor: Shawn Stapleton, Burnaby (CA)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 08/939,539

(22) Filed: Sep. 29, 1997

(51) Int. Cl.[7] .................. H04N 5/21; H04N 5/213; H04N 5/217
(52) U.S. Cl. .............. 348/608; 348/697; 348/622; 332/170
(58) Field of Search ................ 348/475, 607, 348/604, 608, 611, 614, 618, 622, 666, 677, 697; 375/270, 277, 298, 300, 301, 321; 455/47, 48, 108, 109, 202–204; 332/167–171; H04N 5/21, 5/213, 5/217

(56) References Cited

U.S. PATENT DOCUMENTS

| | | | |
|---|---|---|---|
| 4,929,906 A | 5/1990 | Voyce et al. | |
| 4,974,086 A | * 11/1990 | Ehrhardt | 348/738 |
| 5,012,208 A | 4/1991 | Makinen et al. | |
| 5,066,922 A | 11/1991 | Leitch | |
| 5,162,763 A | * 11/1992 | Morris | 332/170 |
| 5,177,611 A | 1/1993 | Gibson et al. | |
| 5,287,180 A | * 2/1994 | White | 348/484 |
| 5,293,406 A | 3/1994 | Suzuki | |
| 5,351,016 A | 9/1994 | Dent | |
| 5,371,481 A | * 12/1994 | Tiittanen et al. | 332/103 |
| 5,396,196 A | 3/1995 | Blodgett | |
| 5,423,082 A | 6/1995 | Cygan et al. | |
| 5,469,105 A | 11/1995 | Sparks | |
| 5,542,096 A | 7/1996 | Cygan et al. | |
| 5,564,087 A | 10/1996 | Cygan et al. | |
| 5,574,994 A | 11/1996 | Huang et al. | |
| 5,900,778 A | * 5/1999 | Stonick et al. | 332/103 |
| 6,081,158 A | * 6/2000 | Twitchell et al. | 330/149 |

* cited by examiner

*Primary Examiner*—Vivek Srivastava
(74) *Attorney, Agent, or Firm*—Kenneth M. Massaroni; Hubert J. Barnhardt, III; Shelley L. Couturier

(57) ABSTRACT

A digital signal processing vestigial-sideband television modulator receives a television signal. The present invention digitizes the television signal to generate a video signal and a digital processor processes the video signal to generate a complex baseband signal. The complex baseband signal is converted into an in-phase baseband signal and a quadrature baseband signal and modulated to respectively generate a modulated in-phase baseband signal and a modulated quadrature baseband signal. The modulated in-phase baseband signal and the modulated quadrature baseband signal are combined to produce a vestigial radio frequency television signal. The undesired sideband of the vestigial radio frequency television signal is tapped, filtered, and, subsequently, the power level of the undesired sideband is detected. Any imbalance in the modulation process is compensated by using the detected power level of the undesired sideband.

16 Claims, 2 Drawing Sheets

SYSTEM AND METHOD FOR ADAPTIVELY BALANCING QUADRATURE MODULATORS FOR VESTIGIAL-SIDEBAND GENERATION

BACKGROUND OF THE INVENTION

1. Technical Field

The present invention generally relates to video digital signal processing (DSP) systems for generating vestigial-sideband (VSB) signals and, more particularly, to a system and method for adaptively balancing quadrature modulators in a video digital signal processing system for generating vestigial-sideband signals.

2. Description of Related Art

Frequency translation is the basic idea behind radio communications. That is, frequency translation allows the generation of signals in radio communications systems with desirable transmission characteristics, such as antenna size, freedom of interference from similar information sources, line-of-sight to long-range propagation, and freedom of interference from noise sources. Moreover, frequency translation permits the efficient utilization of open and closed propagation media by many simultaneous users and/or signals.

One of the most used forms of frequency translation is linear modulation, the most common of which is amplitude modulation. In general, amplitude modulation consists of varying the magnitude of the carrier signal in direct correspondence to the instantaneous fluctuations of a modulating signal source, as described in Electronics Engineers' Handbook, 3rd Edition, Donald G. Fink and Donald Christiansen, Eds., 1989, Section 14, *Modulators, Demodulators, and Converters*, hereby incorporated by reference.

Variations of the basic amplitude modulation process have been developed to achieve more efficient spectrum utilization and to reduce transmitter power requirements. An example is a vestigial-sideband modulation system. In a vestigial-sideband modulation system, information transmitted by an amplitude modulated carrier is wholly contained in the modulation sidebands. The transmission of the carrier energy adds no information and, moreover, each sideband contains the same information, and only one is required to transmit the "intelligence". As such, elimination of one sideband can effect a substantial transmitter power saving. Elimination of one sideband is typically known as vestigial-sideband transmission modulation. The unwanted sideband is generally filtered out at a transmitter or receiver and is known as transmitter attenuation or receiver attenuation, respectively. The primary objective of vestigial-sideband transmission modulation systems is to conserve spectrum in the transmission medium.

Presently, vestigial-sideband signals, for example, television VSB signals, are transmitted using analog modulation techniques. For example, a typical television VSB signal transmission system uses traditional surface acoustic wave (SAW) filters for suppressing the unwanted sideband. SAW filters have errant imperfections, however, because they are temperature and power sensitive.

The present systems do not use digital signal processing techniques, which are less temperature and power sensitive than analog processing techniques, to generate television VSB signals because DSP processors have only recently achieved the speed, complexity, and price requirements to perform video digital signal processing. With the advent of digital signal processing, however, there are new demands on quadrature modulators performance (balance).

Using DSP techniques to generate video VSB signals has created a new need for balancing quadrature modulators. That is, imbalances in the quadrature modulators typically result in the lower sideband being −40 dB below the desired signal. It is desirable, however, that spurious products, such as the lower sidebands, be −60 dB below the desired signal in a video VSB system. Quadrature modulator errors include gain imbalance, phase imbalance, and DC offset errors.

Referring to FIG. 1, there is shown a conventional quadrature modulator 100. Quadrature modulator 100 comprises two bi-phase modulators 102 and 104, a phase shifter 106, and a combiner 108. The quadrature modulator 100 generally operates as follows. The modulator 102 modulates a first carrier signal 110 using an in-phase (I) baseband signal 112 to produce a modulated in-phase signal 114. The phase shifter 106 receives the first carrier signal 110 and generates a second carrier signal 116, wherein the second carrier signal 116 is in quadrature with the first carrier signal 110 (that is, the second carrier signal 116 is 90° out of phase with the first carrier signal 110).

The modulator 104 modulates the second carrier signal 116 with a quadrature (Q) baseband signal 118 to produce a modulated quadrature signal 120, wherein the modulated quadrature signal 120 is in quadrature with the modulated in-phase signal 114. The modulated in-phase signal 114 and the modulated quadrature signal 120 are then combined in-phase by the combiner 108 to produce a radio frequency (RF) output signal 122.

The in-phase baseband signal 112 and the quadrature baseband signal 118 typically range in frequency from approximately 0 Hz to 2.5 MHz. The frequency of the first carrier signal 110 is approximately between 100 MHz and 1000 MHz. These frequencies are provided for illustrative purposes only, and may be other values. As will be appreciated, the transmit frequency of the RF output signal 122 is substantially equal to the frequency of the first carrier signal 110.

Modulators 102 and 104 include imperfections that may result in the generation of undesired mixing products. That is, because of the imperfections in the modulators 102 and 104, the RF output signal 122 may include undesired signal components having frequencies equal to the frequency of the in-phase baseband signal 112, the frequency of the quadrature baseband signal 118, the frequencies of the first and/or second carrier signals 110 and 116, and/or combinations of these frequencies.

The signal components having frequencies equal to the frequencies of the first and second carrier signals 110 and 116 are difficult to eliminate from the RF output signal 122 because their frequencies are so close to the transmit frequency of the RF output signal 122. These undesired signal components are commonly known as carrier leakage signals, or simply carrier leakage, because they originate from the first and second carrier signals 110 and 116, respectively.

Referring to FIG. 2, there is shown a graph 200 in the frequency domain of the energy output of the circuit of FIG. 1. The RF output signal 122 has a carrier leakage having a frequency of, for example, $w_c$ 202, an undesired sideband having a frequency of+for example, $w_c-w_m$ 204, and a desired sideband having a frequency of, for example, $w_c+w_m$ 206. The carrier leakage frequency $w_c$ 202 and undesired sideband $w_c-w_m$ 204 represent wasted power and interference, and produce other undesirable effects such as jitter. As such, it is desirable to suppress the carrier leakage frequency $w_c$ 202 and the undesired sideband frequency $w_c-w_m$ 204.

It is possible to eliminate the carrier leakage and undesired sideband by applying appropriate DC offsets, amplitude and phase balancing to the quadrature modulator. Also, carrier leakage and undesired sidebands can be eliminated by appropriately selecting component values to thereby balance the bi-phase modulators contained in quadrature modulators.

The application of DC offsets to the quadrature modulator and the selection of component values to balance the bi-phase modulators, however, do not represent complete solutions since carrier leakage varies with many factors, such as temperature, frequency, load impedance, and carrier power.

Some radio communications systems attempt to resolve the above problem of suppressing carrier leakage and undesired sidebands. One such system is disclosed in U.S. Pat. No. 5,162,763 to Morris. Morris is directed to a single sideband modulator for translating low frequency baseband signals directly to radio frequency in a single stage. Morris discloses monitoring amplitude of the RF output of the single sideband modulator, comparing it with the baseband signals, and generating continuous control signals to keep a local oscillator breakthrough and image sidebands down to a low level. Morris further discloses adjusting the DC offsets at the baseband inputs to the balanced modulators to cancel carrier breakthrough. Morris is not, however, directed to a video digital signal processing system for generating video vestigial-sideband signals and, as such, Morris does not address the problems of balancing quadrature modulators in a video DSP system, for example, balancing gain imbalance and phase imbalance. Moreover, Morris requires the generation of control signals and monitoring of the amplitude of the RF output to control imperfections in the quadrature modulator.

Other radio communications systems attempt to resolve the above problem of suppressing carrier leakage and undesired sidebands by comparing signal vectors. One such system is disclosed in U.S. Pat. No. 5,396,196 to Blodgett. Blodgett is directed to a carrier leakage suppression circuit which suppresses carrier leakage in a signal processing device which modulates a carrier signal with an in-phase baseband signal and a quadrature baseband signal to generate an RF output signal. The carrier leakage suppression circuit operates by imparting a first signature (a first code) to the in-phase baseband signal and a second signature (a second code) to the quadrature baseband signal prior to modulation of the carrier signal. In-phase and quadrature carrier leakage components in the RF output signal are isolated and measured by respectively correlating the RF output signal with the first and second signatures. An in-phase offset and a quadrature offset are generated as a function of the measurement of the in-phase and quadrature carrier leakage components. The in-phase baseband signal is combined with the in phase offset and the quadrature baseband signal is combined with the quadrature offset to thereby suppress carrier leakage. Blodgett is also not directed to a video digital signal processing system for generating video vestigial-sideband signals and, as such, Blodgett does not address the problems of balancing quadrature modulators in a video DSP system.

Accordingly, there is a significant need for a system and method for balancing quadrature modulators in a video digital signal processing system for generating vestigial-sideband signals wherein carrier leakage is suppressed even when the carrier leakage changes due to temperature, frequency, load impedance, and carrier power.

SUMMARY OF THE INVENTION

The limitations cited above and others are substantially overcome through the system and method disclosed herein.

The present invention overcomes a problem that arises when applying digital signal processing techniques to generate (or synthesize) a vestigial television signal. The DSP synthesized modulator uses an analog quadrature modulator to modulate the complex baseband signal to a standard television IF frequency, for example, 45.7 MHz, for the NTSC standard. IF frequencies as high as 1 GHz may be used to simplify the overall design of the modulator. The modulator maintains spurious products below −60 dBc. The quadrature modulator is balanced by fine tuning (adjusting) a quadrature modulator compensator. The invention uses feedback techniques to constantly "balance" the quadrature modulator under operation conditions and over temperature range fluctuations. Balance is achieved by sampling the undesired signals (distortion) on the output, and tuning the quadrature modulator compensator until the distortion is minimized.

A digital signal processing vestigial-sideband television modulator in accordance with the teachings of the present invention comprises means for receiving a television signal; means for digitizing the television signal to generate a video signal; means for digitally processing the video signal to generate a complex baseband signal; means for converting the complex baseband signal into an in-phase baseband signal and a quadrature baseband signal; means for modulating the in-phase baseband signal and the quadrature baseband signal to respectively generate a modulated in-phase baseband signal and a modulated quadrature baseband signal; means for combining the modulated in-phase baseband signal and the modulated quadrature baseband signal to produce a vestigial radio frequency television signal; means for tapping off intermodulation distortion of the vestigial radio frequency television signal; means for filtering the intermodulation distortion of the vestigial radio frequency television signal; means for detecting the power level of the intermodulation distortion of the vestigial radio frequency television signal; and means for compensating imbalances in the modulating means using the detected power level of the intermodulation distortion of the vestigial radio frequency television signal.

A method in accordance with the teachings of the present invention for compensating imbalances in a digital signal processing vestigial-sideband television modulator is characterized by the steps of receiving a television signal; digitizing the television signal to generate a video signal; digitally processing the video signal to generate a complex baseband signal; converting the complex baseband signal into an in-phase baseband signal and a quadrature baseband signal; modulating the in-phase baseband signal and the quadrature baseband signal to respectively generate a modulated in-phase baseband signal and a modulated quadrature baseband signal; combining the modulated in-phase baseband signal and the modulated quadrature baseband signal to produce a vestigial radio frequency television signal; tapping off an undesired sideband of the vestigial radio frequency television signal; filtering the undesired sideband of the vestigial radio frequency television signal; detecting the power level of the undesired sideband of the vestigial radio frequency television signal; and compensating imbalances in the quadrature modulator using the detected power level of the undesired sideband of the vestigial radio frequency television signal.

An apparatus for balancing quadrature modulators in a digital signal processing system in accordance with the teachings of the present invention comprises a receiver for receiving intermodulation distortion of a vestigial radio frequency television signal from the digital signal processing system; a filter for filtering the intermodulation distortion of the vestigial radio frequency television signal; a detector for detecting the power level of the intermodulation distortion of the vestigial radio frequency television signal; and means for compensating imbalances in the quadrature modulators using said detected power level of the intermodulation distortion of the vestigial radio frequency television signal.

The above features and advantages of the present invention will be better understood from the following detailed description taken into conjunction with the accompanying drawings.

BRIEF DESCRIPTION OF THE DRAWINGS

FIG. 3 illustrates a circuit block diagram of a digital signal processing vestigial-sideband television modulator in accordance with the teachings of the present invention.

DETAILED DESCRIPTION

Figure 1:
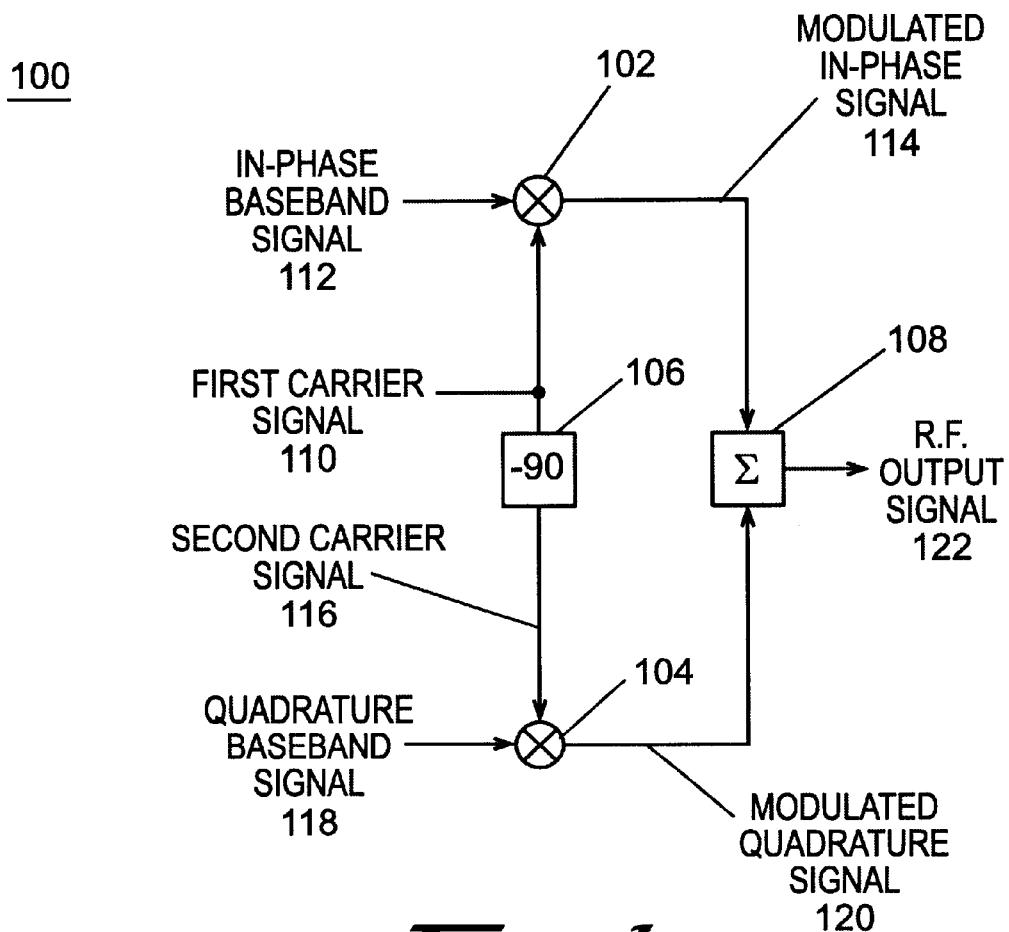
FIG. 1 illustrates a conventional quadrature modulator.
Figure 2:
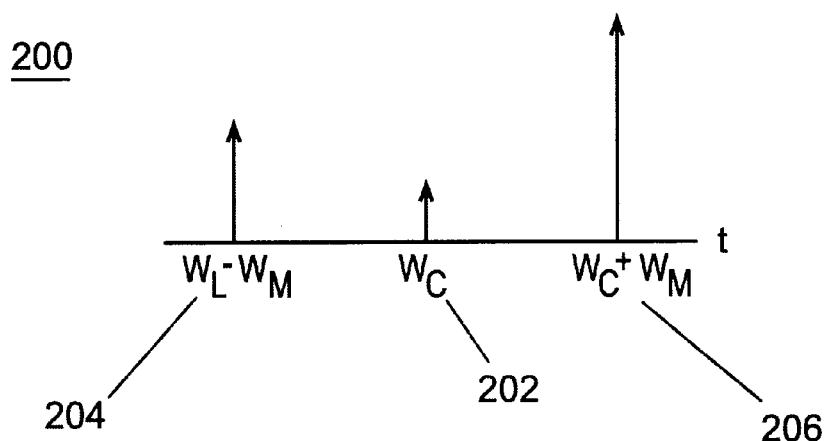
FIG. 2 illustrates a graph in the frequency domain of the energy output of the quadrature modulator of FIG. 1.
Figure 1:
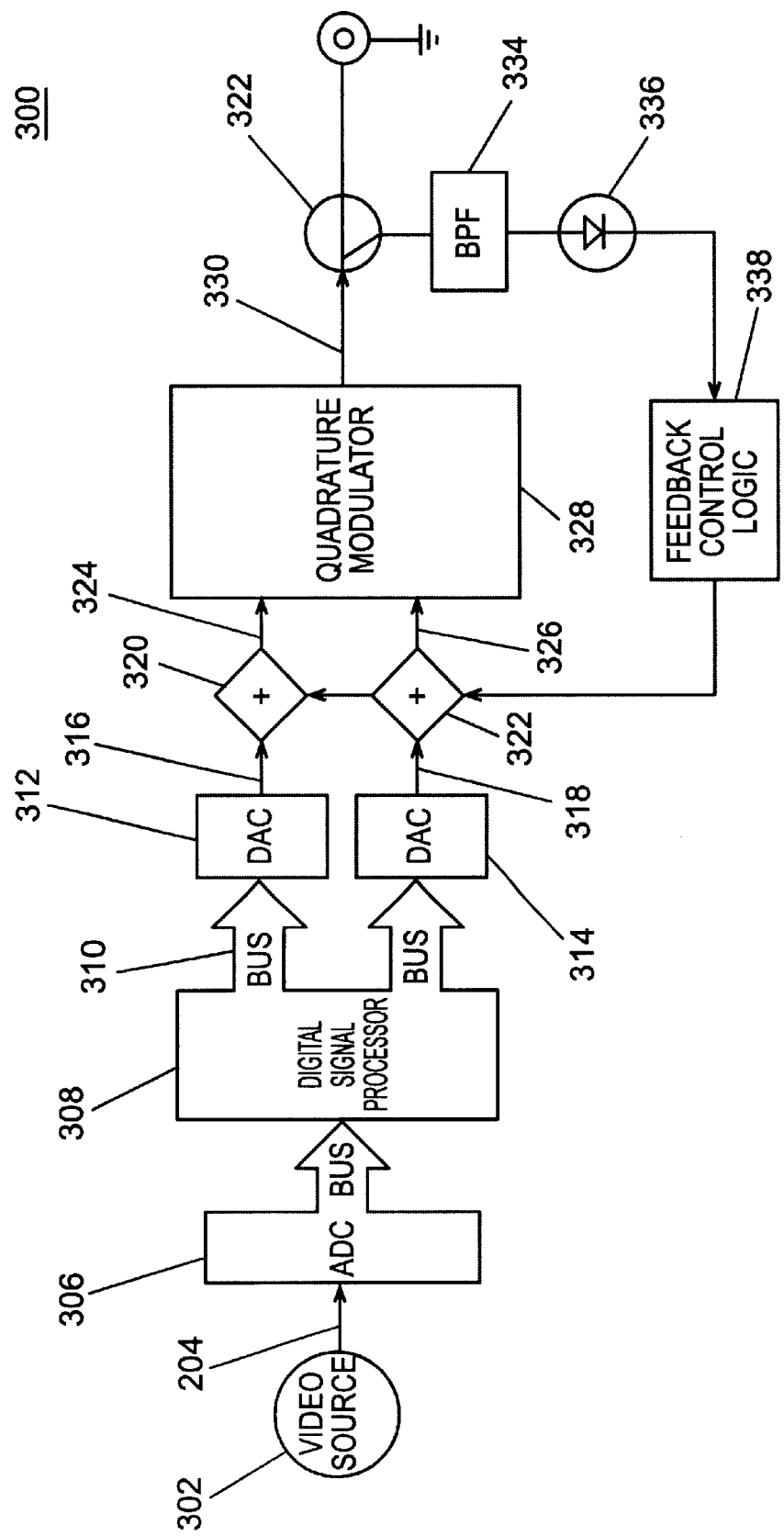

Referring to FIG. 3, there is shown a circuit block diagram of a digital signal processing vestigial-sideband television modulator (DSP TV modulator) 300 in accordance with the teachings of the present invention. Video signal 304 from, for example, video source 302 enters the DSP TV modulator 300 and is digitized in, for example, analog-to-digital converter (ADC) 306. The video signal 304 then enters, for example, DSP processor 308, which digitally clamps (fixes the DC level of) the video signal 304, provides group delay predistortion (adjusts the phase vs. frequency response of the filter to have a desired characteristic), and band limits the video signal 304 using digital signal processing techniques such as, for example, Finite Impulse Response (FIR) filtering techniques. A complex baseband signal 310 is generated at the output of the DSP processor 308. The complex baseband signal 310 is then fed to the input of, for example, two digital-to-analog converters (DACs) 312 and 314, respectively. The DAC 312 generates an in phase baseband signal 316 and the DAC 314 generates a quadrature baseband signal 318. The in-phase baseband signal 316 is then fed into the input of, for example, quadrature modulator 328 via, for example, a first input bias adjustment circuit 320 to provide coarse adjustment of the DC offset for the in phase baseband signal 324. Similarly, the quadrature baseband signal 318 is fed to the input of, for example, quadrature modulator 328 via, for example, a second input bias adjustment circuit 322 to provide coarse adjustment of the DC offset for the quadrature baseband signal 326.

The in-phase and quadrature baseband signals 324 and 326, respectively, enter, for example, quadrature modulator 328, which produces a vestigial IF television signal 330, for example, at an IF frequency of 45.75 MHz for the NTSC television standard. The typical IF frequency range is from 50 MHz to 1 GHz. The vestigial IF television signal 330 is then tapped off via, for example, a directional coupler 332. The vestigial IF television signal 330 is then fed to, for example, a bandpass filter 334. After the bandpass filter 334, the vestigial IF television signal 330 is fed to, for example, level detector 336; level detector 336 converts power to voltage which is used to compensate for the imbalances of the quadrature modulator 328. The bandpass filter 334 passband is centered on one of the undesired signals (second order intermodulation product $(w_c+2w_m)$). This results in minimizing the undesired signal power $(w_c-w_m)$, as well as minimizing the carrier leakage signal power $(w_c)$ without requiring a quadrature demodulator that has perfect amplitude and phase balance and no DC offset. The signal at the level detector 336 represents an undesired sideband information (distortion) created from imbalances in the quadrature modulator 328, for example, amplitude imbalance, phase imbalance, and DC offsets. A feedback control logic 338 is provided for monitoring the signals from the level detector 336 and for adaptively adjusting the quadrature modulator compensator at the input of the quadrature modulator 328, that is, modulated in-phase and quadrature baseband signals 324 and 326, to minimize the distortion.

An advantage of the present invention is that it eliminates the need for SAW filters, which frequency characteristics are temperature and power dependent. The present invention provides for, for example, a bandpass filter, a power detector, and a feedback control logic for detecting the vestigial IF television signal 330 as a voltage. The feedback control logic 338 adaptively adjusts the power level which controls the DC offset-and the amplitude and phase imbalance. In other words, the present invention provides for a system and method for balancing quadrature modulators in a video digital signal processing system by measuring power in the feedback signal instead of measuring the raw amplitude of the feedback signal.

As discussed above, Blodgett suppresses carrier leakage by comparing vectors of transmitted and feedback signals and compensating for any errors therebetween. In contrast, the present invention balances quadrature modulators by measuring the power of the vestigial IF television signal (feedback signal) as the integral of the amplitude of the vestigial IF television signal over time, that is, the bandpass filter integrates the vestigial IF television signal across its bandwidth to obtain the net power of the second order intermodulation product. Blodgett only looks at a vector and compensates by adding in an error to the original signal to get the desired signal. An advantage of the present invention over the vector method is that it effectively compensates the distortion (undesired) signal by balancing the amplitude imbalance, phase imbalance, and DC offsets in the quadrature modulators, which Blodgett cannot do.

While the invention has been described in detail with reference to a preferred embodiment and selected variations thereof, it should be apparent to those skilled in the art that many modifications and variations are possible without departure from the scope and spirit of this invention as defined in the appended claims.

What is claimed is:

1. A digital signal processing vestigial-sideband television modulator comprising:

means for receiving a television signal;

means for digitizing said television signal to generate a digital video signal;

means for digitally processing said digital video signal to generate a complex baseband signal, wherein said digitally processing means digitally clamps said digital video signal; provides group delay predistortion to said digital video signal; and band limits said digital video signal using a digital signal processing technique;

means for converting said complex baseband signal into an in-phase baseband signal and a quadrature baseband signal;

means for modulating said in-phase baseband signal and said quadrature baseband signal to respectively generate a modulated in-phase baseband signal and a modulated quadrature baseband signal;

means for combining said modulated in-phase baseband signal and said modulated quadrature baseband signal to produce a vestigial radio frequency television signal;

means for tapping off intermodulation distortion of said vestigial radio frequency television signal;

means for filtering said intermodulation distortion wherein the means for filtering comprises a bandpass filter with a passband centered on the second order intermodulation product of Wc+2Wm selected for minimizing signal power and carrier leakage, wherein Wc is the frequency of the carrier leakage and Wm is the frequency of the undesired mixing products;

means for detecting the power level of said intermodulation distortion; and means for compensating imbalances in said modulating means using said detected power level of said intermodulation distortion wherein imbalances include amplitude imbalance, phase imbalance and DC offsets.

2. The digital signal processing vestigial-sideband television modulator of claim 1, wherein said digitizing means includes an analog-to-digital converter.

3. The digital signal processing vestigial-sideband television modulator of claim 1, wherein said digital signal processing technique includes an impulse response technique.

4. The digital signal processing vestigial-sideband television modulator of claim 1, wherein said converting means includes digital-to-analog converters.

5. The digital signal processing vestigial-sideband television modulator of claim 1, wherein said modulating means includes a quadrature modulator.

6. The digital signal processing vestigial-sideband television modulator of claim 1, wherein said combining means includes a quadrature modulator.

7. The digital signal processing vestigial-sideband television modulator of claim 1, wherein said vestigial radio frequency television signal has a frequency of approximately 45.75 MHz.

8. The digital signal processing vestigial-sideband television modulator of claim 1, wherein said tapping off means includes a directional coupler.

9. The digital signal processing vestigial-sideband television modulator of claim 1, wherein said filtering means has a passband that is centered on an undesired sideband signal.

10. The digital signal processing vestigial-sideband television modulator of claim 1, wherein said detecting means includes a diode.

11. The digital signal processing vestigial-sideband television modulator of claim 1 wherein said detected power level of said intermodulation distortion is the power level of an undesired sideband signal.

12. The digital signal processing vestigial-sideband television modulator of claim 1, further comprising means for converting said detected power level of said intermodulation distortion to a voltage level.

13. A method for compensating imbalances in a digizal signal processing vestigial-sideband television modulator, comprising the steps of:

receiving a television signal;

digitizing said television signal to generate a digital video signal; digitally processing said digital video signal to generate a complex baseband signal, wherein said digitally processing step comprises the steps of:
digitally clamping said digital video signal;
providing group delay predistortion to said digital video signal; and
band limiting said digital video signal using a digital signal processing technique;

converting said complex baseband signal into an in-phase baseband signal and a quadrature baseband signal;

modulating said in-phase baseband signal and said quadrature baseband signal to respectively generate a modulated in-phase baseband signal and a modulated quadrature baseband signal;

combining said modulated in-phase baseband signal and said modulated quadrature baseband signal to produce a vestigial radio frequency television signal;

tapping off an undesired sideband of said vestigial radio frequency television signal;

filtering said undesired sideband wherein the filtering comprises a bandpass filter with a passband centered on the second order intermodulation product of Wc+2 Wm selected for minimizing signal power and carrier leakage, wherein Wc is the frequency of the carrier leakage and Wm is the frequency of the undesired mixing products, detecting the power level of said undesired sideband; and compensating imbalances in said modulating means using said detected power level of said undesired sideband, wherein imbalances include amplitude imbalance, phase imbalance and DC offsets.

14. The method of claim 13, wherein said digital signal processing technique includes an impulse response technique.

15. The method of claim 13, wherein said vestigial radio frequency television signal has a frequency between approximately 50 MHz and 1000 MHz.

16. The method of claim 13, further comprising the step of converting said detected power level of said undesired sideband to a voltage level.

* * * * *

UNITED STATES PATENT AND TRADEMARK OFFICE
CERTIFICATE OF CORRECTION

PATENT NO.     : 6,618,096 B1
DATED          : September 9, 2003
INVENTOR(S)    : Stapleton It is certified that error appears in the above-identified patent and that said Letters Patent is hereby corrected as shown below:

<u>Column 2,</u>
Line 60, delete "of+for" and insert therefore -- of, for --.

<u>Column 8,</u>
Line 5, delete "digizal" and insert therefore -- digital --.

Signed and Sealed this

Tenth Day of February, 2004

JON W. DUDAS
*Acting Director of the United States Patent and Trademark Office*